United States Patent
Harris et al.

(10) Patent No.: US 8,982,610 B2
(45) Date of Patent: Mar. 17, 2015

(54) LOW POWER STATIC RANDOM ACCESS MEMORY

(71) Applicant: Raytheon Company, Waltham, MA (US)

(72) Inventors: Micky Harris, Lompoc, CA (US); Wasim Khaled, Austin, TX (US)

(73) Assignee: Raytheon Company, Waltham, MA (US)

(*) Notice: Subject to any disclaimer, the term of this patent is extended or adjusted under 35 U.S.C. 154(b) by 134 days.

(21) Appl. No.: 13/750,943

(22) Filed: Jan. 25, 2013

(65) Prior Publication Data

US 2014/0211548 A1   Jul. 31, 2014

(51) Int. Cl.
| | |
|---|---|
| G11C 11/00 | (2006.01) |
| G11C 11/419 | (2006.01) |
| G11C 7/12 | (2006.01) |
| G11C 11/412 | (2006.01) |
| G11C 11/418 | (2006.01) |

(52) U.S. Cl.
CPC ............... *G11C 11/419* (2013.01); *G11C 7/12* (2013.01); *G11C 11/412* (2013.01); *G11C 11/4125* (2013.01); *G11C 11/418* (2013.01)
USPC .......................................... 365/156; 365/205

(58) Field of Classification Search
CPC .......................... G11C 11/412; G11C 11/4091
USPC ................................................ 365/156, 205
See application file for complete search history.

(56) References Cited

U.S. PATENT DOCUMENTS

| | | | |
|---|---|---|---|
| 6,181,640 B1 | 1/2001 | Kang | |
| 6,301,146 B1 * | 10/2001 | Ang et al. | ...................... 365/154 |
| 6,643,166 B1 | 11/2003 | Ting et al. | |
| 8,233,341 B2 * | 7/2012 | Deng et al. | ..................... 365/201 |
| 2003/0169619 A1 | 9/2003 | Karlsson et al. | |
| 2007/0103195 A1 | 5/2007 | Duk-Sohn et al. | |
| 2007/0268740 A1 | 11/2007 | Aly et al. | |
| 2007/0297249 A1 | 12/2007 | Chang et al. | |
| 2008/0165602 A1 | 7/2008 | Sutardja et al. | |

OTHER PUBLICATIONS

Written Opinion of the International Searching Authority for International Application No. PCT/US2014/012403, filed Jan. 21, 2014, Written Opinion of the International Searching Authority mailed Mar. 24, 2014 (5 pgs.).
International Search Report for International Application No. PCT/US2014/012403, filed Jan. 21, 2014, International Search Report dated Mar. 17, 2014 and mailed Mar. 24, 2014 (3 pgs.).

* cited by examiner

*Primary Examiner* — Michael Tran
(74) *Attorney, Agent, or Firm* — Christie, Parker & Hale, LLP

(57) ABSTRACT

A bit line driver for a static random access memory (SRAM) cell including: a first voltage supply for supplying a first voltage; a second voltage supply for supplying a second voltage that is less than the first voltage; a write circuit to drive a bit line and an inverse bit line when writing to the SRAM cell; and a pre-charge circuit to pre-charge the bit line and the inverse bit line before reading the content of the SRAM cell. The bit line driver supplies a voltage less than the first voltage by a threshold voltage of one transistor to the bit line or the inverse bit line when the bit line driver drives the bit line or the inverse bit line to a high state.

19 Claims, 6 Drawing Sheets

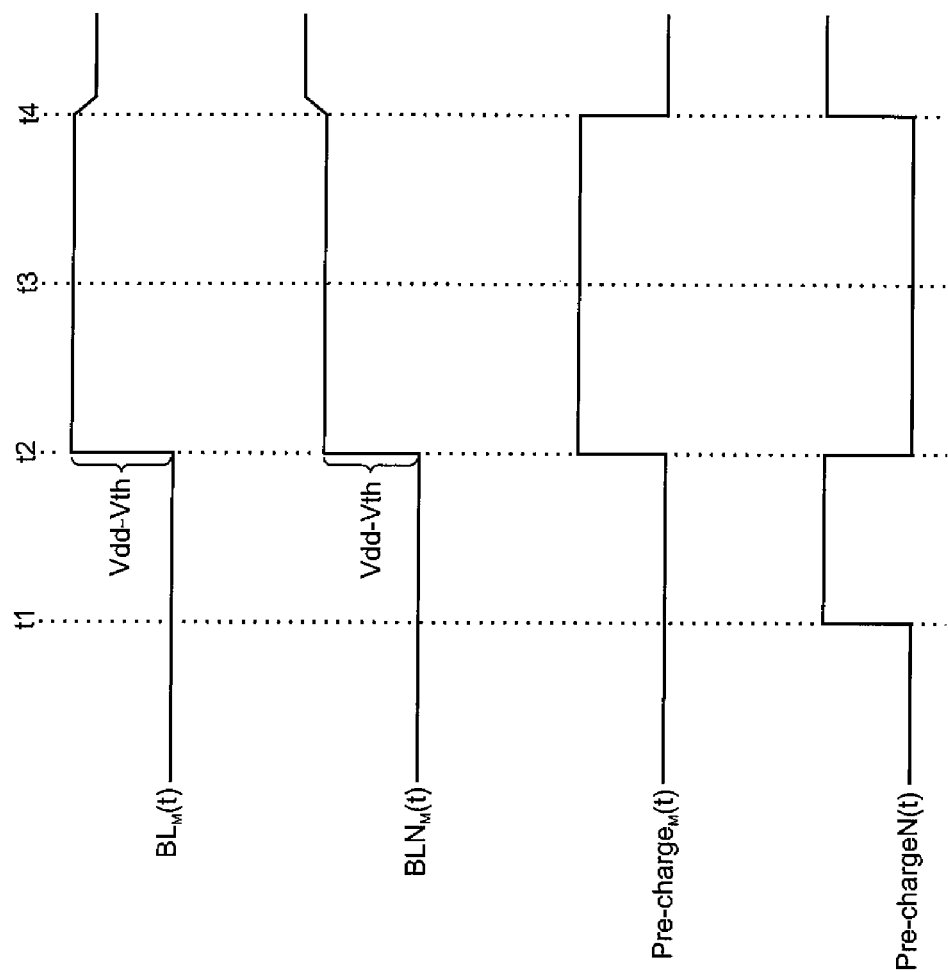

LOW POWER STATIC RANDOM ACCESS MEMORY

STATEMENT REGARDING FEDERALLY SPONSORED RESEARCH OR DEVELOPMENT

This invention was made with U.S. government support. The U.S. government has certain rights to this invention.

BACKGROUND

1. Field

Aspects of the present invention relate to low power static random access memory.

2. Description of Related Art

Static random access memory (SRAM) is widely used in digital systems to provide memory for use with digital computers and other applications. SRAM has an advantage of high speed and ease of use as compared to some other types of memory systems. In addition, SRAM using MOS technology exhibits low standby power and does not require a refresh cycle to maintain the information stored.

SRAM systems are often organized into an array of SRAM cells, arranged in rows and columns. Generally, SRAM cells are set to one of two data states when storing a bit of information. Each memory cell may be referenced by a unique memory address, which includes a row address and a column address. The term "word line" refers to a conductor that corresponds to a row of SRAM cells, and the term "bit lines" refers to a set of conductors that correspond to a column of SRAM cells. The word line may be driven by a word line driver, and the bit lines may be driven by a bit line driver. A SRAM cell may include of pair of complementary ports, with each port coupled to one of the two bit lines corresponding to that column, two cross-coupled inverters to store a memory bit, and two access transistors to control access to the cross-coupled inverters.

SRAM arrays may operate in a read mode and a write mode. When reading from a SRAM cell, the bit lines associated with the SRAM cell are pre-charged to the high logic state, the corresponding word line is activated to read out the stored logic state, and the logic state is differentially sensed from the bit lines using a sense amplifier. The sense amplifier outputs a signal corresponding to the logic state stored in the SRAM, cell. When writing to a SRAM cell, the bits lines associated with the SRAM cell are complementarily driven to a logic state, the corresponding word line is activated to access the SRAM cell, and the SRAM cell is latched to a specific logic state, with a logic high indicated on one port and a logic low indicated on the other port.

In a SRAM array, the read and write cycles consume the majority of the power due to the discharge and charging operation of the bit lines. The frequency of operation, the working voltage, and the capacitance of each bit line are factors in determining the power consumed in each operation. The consumed power can be calculated as $C*V^2*F$, where C is the capacitance of a bit line, V is the working voltage (i.e., the swing voltage of the bit line), and F is the frequency that a bit line is charged and discharged.

SUMMARY

Aspects of the present invention provide for static random access memory (SRAM) having a low power consumption.

In a typical SRAM array, when the bit lines are pre-charged or written to, the voltage of at least one of the bit lines is driven to the supply voltage. However, the SRAM row access gate does not pass the full supply voltage, but instead, may pass up to a voltage less than the supply voltage by its threshold voltage. Therefore, by reducing the voltage swing of the bit line, the power may be reduced according to the square of the voltage reduction. Accordingly, aspects of the present invention provide a SRAM array configured to charge the bit lines to a voltage less than the supply voltage to reduce power consumption.

An embodiment of the present invention provides for a bit line driver for a static random access memory (SRAM) cell including: a first voltage supply for supplying a first voltage; a second voltage supply for supplying a second voltage that is less than the first voltage; a write circuit for driving a bit line and an inverse bit line when writing to the SRAM cell; and a pre-charge circuit for pre-charging the bit line and the inverse bit line before reading the content of the SRAM cell, in which when the bit line driver drives the bit line or the inverse bit line to a high state, the bit line driver supplies voltage less than the first voltage by a threshold voltage of one transistor to the bit line or the inverse bit line.

In an embodiment, when the write circuit drives the bit line to the high state, the write circuit supplies the voltage less than the first voltage by the threshold voltage of one transistor to the bit line, and when the write circuit drives the inverse bit line to the high state, the write circuit supplies the voltage less than the first voltage by the threshold voltage of one transistor to the inverse bit line.

The write circuit may include: a pair of pull-up circuits; a pair of pull-down circuits each having a gate cross-coupled with a gate of an opposite side pull-up circuit of the pair of pull-up circuits; and a pair of access circuits each interposed between a corresponding one of the pull-up circuits and a same-side pull-down circuit of the pair of pull-down circuits, and the write circuit may selectively pull-up or pull-down the bit line and the inverse bit line according to a data signal and a write signal. In one embodiment, the pair of pull up circuits includes: a first transistor coupled between the first voltage supply and the bit line; and a second transistor coupled between the first voltage supply and the inverse bit line, the pair of pull down circuits includes: a third transistor coupled between the second voltage supply and the bit line; and a fourth transistor coupled between the second voltage supply and the inverse bit line, and the pair of access circuits includes: a fifth transistor interposed between the first transistor and the bit line; a sixth transistor interposed between the second transistor and the inverse bit line; a seventh transistor interposed between the third transistor and the bit line; and an eighth transistor interposed between the fourth transistor and the inverse bit line.

The first transistor and the fourth transistor may be turned on and off together, the second transistor and the third transistor may be turned on and off together, and the fifth transistor, the sixth transistor, the seventh transistor, and the eighth transistor may be turned on and off together. The first transistor and fourth transistor may be turned on and off according to the data signal, the second transistor and the third transistor may be turned on and off according to an inverse data signal, which is the inverse of the data signal; and the fifth transistor, the sixth transistor, the seventh transistor, and the eighth transistor may be turned on and off according to the write signal.

At least one of the first transistor or the third transistor and at least one of the second transistor or the fourth transistor are a same type of transistor as a row access transistor of the SRAM cell. In one embodiment, the first transistor, the second transistor, the third transistor, the fourth transistor, the fifth transistor, the sixth transistor, the seventh transistor, and the eighth transistor are n-type transistors. In another embodiment, the first transistor, the second transistor, the third transistor, the fourth transistor, the seventh transistor, and the eighth transistor are n-type transistors, and the fifth transistor and the sixth transistor are p-type transistors.

In an embodiment, when the pre-charge circuit drives the bit line to the high state, the pre-charge circuit supplies the voltage less than the first voltage by the threshold voltage of one transistor to the bit line, and when the pre-charge circuit drives the inverse bit line to the high state, the pre-charge circuit supplies the voltage less than the first voltage by the threshold voltage of one transistor to the inverse bit line.

The pre-charge circuit may include: a first pull-up circuit to pull-up the bit line to the voltage less than the first voltage by the threshold voltage of one transistor according to a pre-charge signal; a second pull-up circuit to pull-up the inverse bit line to the voltage less than the first voltage by the threshold voltage of one transistor according to the pre-charge signal; and a balancing circuit to balance a voltage of the bit line with a voltage of the inverse bit line according to an inverse pre-charge signal. In an embodiment, the first pull-up circuit includes a first transistor interposed between the first voltage supply and the bit line, the second pull-up circuit includes a second transistor interposed between the first voltage supply and the inverse bit line, and the balancing circuit includes a third transistor coupled between the bit line and the inverse bit line.

The first transistor and the second transistor may be a same type of transistor as a row access transistor of the SRAM cell. In one embodiment, the first transistor and the second transistor may be n-type transistors.

Further, aspects of another embodiment of the present invention provide for a static random access memory (SRAM) array including: a plurality of word lines arranged in rows, each of the word lines for supplying a corresponding one of a plurality of word signals; a plurality of bit lines arranged in columns, each of the bit lines for supplying a corresponding one of a plurality of bit signals; a plurality of inverse bit lines arranged with the bit lines in columns, each of the inverse bit lines for supplying a corresponding one of a plurality of inverse bit signals that is the inverse of the bit signal supplied by the corresponding one of the bit lines in a same column; a first voltage supply for supplying a first voltage; a second voltage supply for supplying a second voltage that is less than the first voltage; a plurality of SRAM cells arranged in rows and columns, each of the SRAM cells corresponding to one of each of the word lines, the bit lines, and the inverse bit lines; a word line driver to drive the word lines; and a bit line driver to drive the bit lines and the inverse bit lines, in which, when the bit line driver drives one of the bit lines to a high state, the bit line driver supplies a voltage less than the first voltage by a threshold voltage of one transistor of the bit line driver to the one of the bit lines, and when the bit line driver drives one of the inverse bit lines to the high state, the bit line driver supplies the voltage less than the first voltage by a threshold voltage of one transistor of the bit line driver to the one of the inverse bit lines.

The bit line driver may include a plurality of write circuits, each of the write circuits corresponding to a bit line of the bit lines, an inverse bit line of the inverse bit lines, and a column of the SRAM cells, each of the write circuits may include: a pair of pull-up circuits; a pair of pull-down circuits each having a gate cross-coupled with a gate of an opposite side pull-up circuit of the pair of pull-up circuits; and a pair of access circuits each interposed between a corresponding one of the pull-up circuits and a same-side pull-down circuit of the pair of pull-down circuits, and each of the write circuits may selectively pull-up or pull-down the bit line and the inverse bit line according to a data signal and a write signal.

In an embodiment of the present invention, the pair of pull-up circuits includes n-type transistors.

The bit line driver may include a plurality of pre-charge circuits, each of the pre-charge circuits corresponding to a bit line of the bit lines, an inverse bit line of the inverse bit lines, and a column of the SRAM cells, and each of the pre-charge circuits may include: a first pull-up circuit to pull-up the bit line to the voltage less than the first voltage by the threshold voltage of one transistor according to a pre-charge signal; a second pull-up circuit to pull-up the inverse bit line to the voltage less than the first voltage by the threshold voltage of one transistor according to the pre-charge signal; and a balancing circuit to balance a voltage of the bit line with a voltage of the inverse bit line according to an inverse pre-charge signal.

In an embodiment, the first pull-up circuit and the second pull-up circuit include n-type transistors.

Each of the SRAM cells may include: a first transistor having: a gate coupled to the corresponding word line; a source coupled to the corresponding inverse bit line; and a drain; a second transistor having: a gate coupled to the corresponding word line; a source coupled to the corresponding bit line; and a drain; a third transistor having: gate coupled to the drain of the second transistor; a source coupled to the second voltage supply; and a drain coupled to the drain of the first transistor; a fourth transistor having: a gate coupled to the drain of the first transistor; a source coupled to the second voltage supply; and a drain coupled to the drain of the second transistor; a fifth transistor having: a gate coupled to the drain of the second transistor; a source coupled to the first voltage supply; and a drain coupled to the drain of the first transistor; and a sixth transistor having: a gate coupled to the drain of the first transistor a source coupled to the first voltage supply; and a drain coupled to the drain of the second transistor, in which the first transistor, the second transistor, the third transistor, and the fourth transistor may be n-type transistors, and the fifth transistor and the sixth transistor may be p-type transistors.

BRIEF DESCRIPTION OF THE DRAWINGS

The accompanying drawings illustrate exemplary embodiments of the present invention, and, together with the description, serve to explain the principles of the present invention.

FIG. 6 is a timing diagram of the pre-charge circuit of FIG. 5.

DETAILED DESCRIPTION

Figure 1:
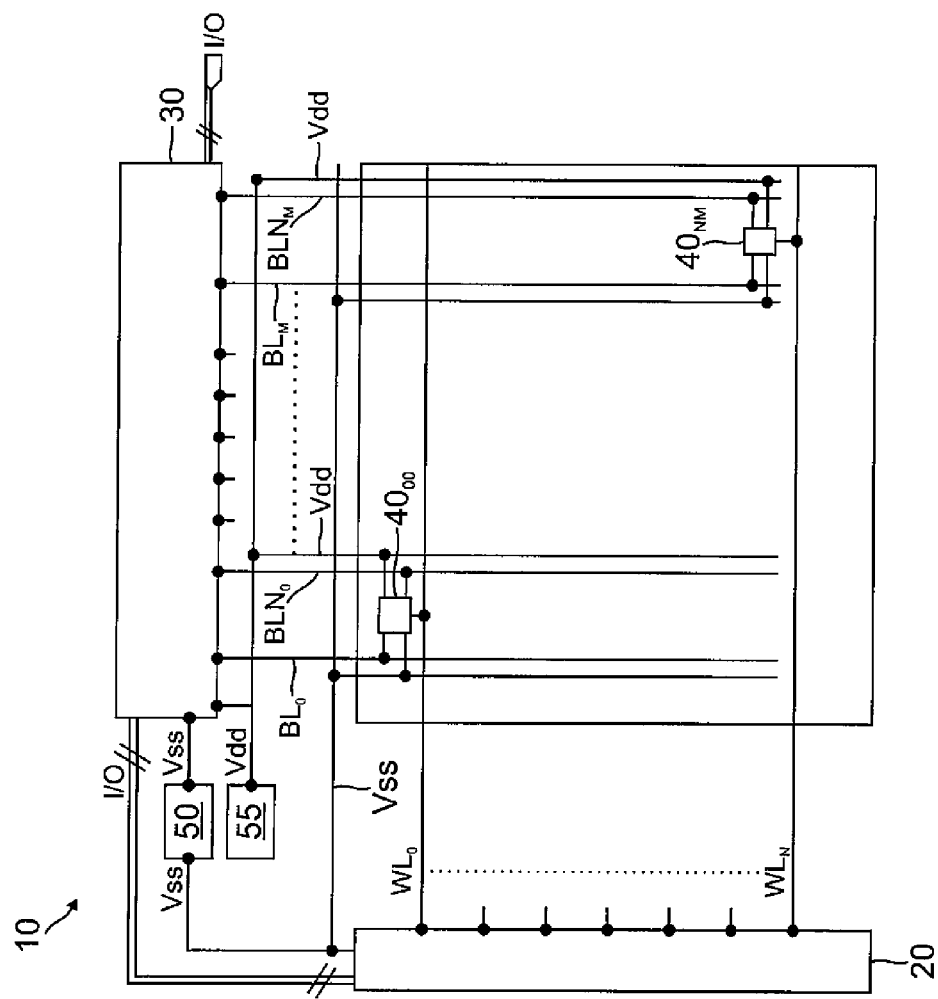
FIG. 1 is a schematic diagram of a low power SRAM array according to an embodiment of the present invention.

Aspects of embodiments of the present invention provide for a low power static access random memory (SRAM) array including a write circuit and/or a pre-charge circuit that each may drive the bit lines to a voltage that is less than the supply voltage by a threshold voltage of a transistor.

According to an embodiment of the present invention, a SRAM cell is coupled to a bit line driver through corresponding bit lines. Here, the bit line driver includes a write circuit and a pre-charge circuit. The write circuit is provided for writing a logic state to the SRAM cell, by differentially driving the bit lines. The pre-charge circuit is configured to pre-charge the bit lines to a high state prior to reading the SRAM cell with a sensing amplifier. The write circuit and/or the pre-charge circuit may drive the bit lines to a high state by driving the bit line voltage to a voltage less than a supply voltage by a threshold voltage of a transistor.

The write circuit and the pre-charge circuit each include a plurality of transistors. At least two of the transistors of the write circuit and/or the pre-charge circuit coupled to the bits lines may be of the same type as the row access transistors of the SRAM cell (e.g., NMOS type transistors). By using the same type of transistors, the voltage swing of the bit lines is limited to the working voltage of the row access transistors (e.g., the supply voltage minus the threshold voltage of the row access transistor). The lowered voltage swing provides a reliable operation, but at a substantially lower power (as compared to driving the bit lines at the supply voltage). The power saved depends on the process node and the supply voltage that the SRAM chip is operated at. For example, for a 180 nm process with 1.8 V supplies and 0.8 V threshold voltages, the reduction in power is by a factor of 3.24 (i.e., $1.8^2/(1.8-0.08)^2$). As such, when using a SRAM array according to embodiments of the present invention, power may be lowered without an increase in area, additional external voltages, or increase in clock operations.

In the following detailed description, only certain embodiments of the present invention are shown and described, by way of illustration. As those skilled in the art would recognize, the invention may be embodied in many different forms and should not be construed as being limited to the embodiments set forth herein. Instead, the detailed description should be construed to encompass the scope of the appended claims and equivalents thereof. Also, in the present application, when an element is referred to as being "coupled" (e.g., electrically coupled or connected) to another element, it can be directly coupled to the another element or indirectly coupled to the another element with one or more intervening elements interposed therebetween. Hereinafter, like reference numerals refer to like elements.

FIG. 1 illustrates a schematic diagram of a low powered SRAM array according to an embodiment of the present invention. In FIG. 1, the SRAM array 10 includes a plurality of SRAM cells 40 arranged in a matrix. The SRAM array includes a word line driver 20, which drives a plurality of word lines WL0 to WLn extending in a row direction, and includes a bit line driver 30, which drives a plurality of bit lines BL0 to BLm and a plurality of inverse bit lines BLN0 to BLNm, which extend in a column direction and cross the word lines WL0 to WLn.

The SRAM cells 40 are arranged in rows and columns, and located at crossing regions of the word lines WL0 to WLn, the bit lines BL0 to BLm, and the inverse bit lines BLN0 to BLNm. Each SRAM cell 40 is coupled to a corresponding one of the word lines WL0 to WLn, the bit lines BL0 to BLm, and the inverse bit lines BLN0 to BLNm. The SRAM cells 40 may be identified by a unique memory address, which includes a row address and a column address. By controlling the word line driver 20 to operate a particular word line WL0 to WLn and controlling the bit line driver 30 to operate a particular bit line pair BL0/BLN0 to BLm/BLNm, a unique SRAM cell 40 may be read from or written to.

The SRAM array 10 may further include a first power supply 55 for providing a first voltage Vdd (i.e., the supply voltage), and a second power supply 50 for providing a second voltage Vss, which is less than the first voltage. In an embodiment of the present invention the first voltage Vdd is about 1.8 V and the second voltage Vss is about 0 V (e.g., ground). The first voltage Vdd and the second voltage Vss may be provided to each SRAM cell 40, the word line driver 20, and the bit line driver 30.

Additionally, the SRAM array 10 may send and receive input/output data via an input/output bus I/O. The input/output data may include data to be stored, retrieved data, memory address information, a clock signal, and the like. The input/output bus may be coupled to an external device (not shown), for example, a microcontroller. The input/output bus I/O may be coupled to the word line driver 20 and the bit line driver 30, however, the present invention is not limited thereto, and the input output bus I/O may be coupled to a SRAM controller (not shown) which may control the word line driver 20 and the bit line driver 30.

Accordingly, the SRAM array 10 according to aspects of the present invention stores and retrieves bits of data in the SRAM cells 40 by address (i.e., row and column).

Figure 2:
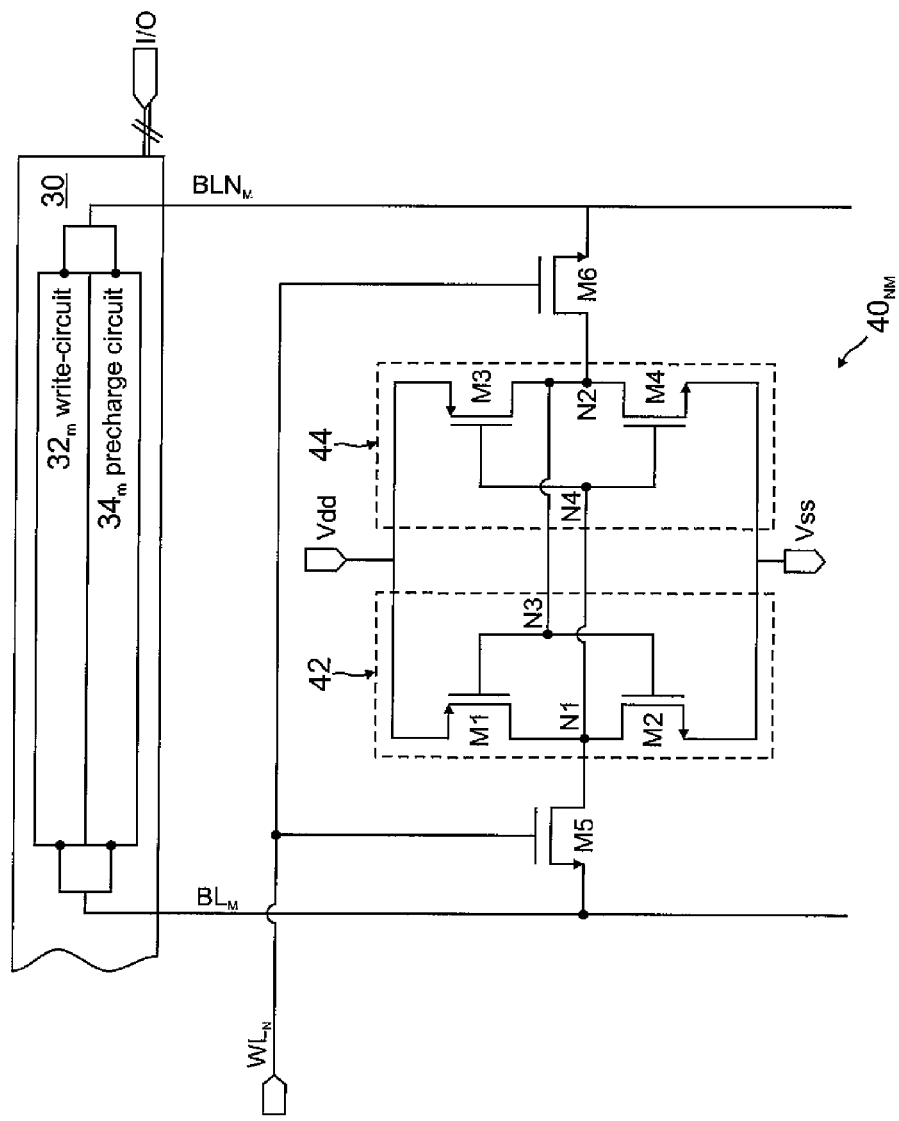
FIG. 2 is a schematic diagram of a SRAM cell of the SRAM array of FIG. 1.

The operation of a SRAM cell will now be described in detail with reference to FIG. 2. FIG. 2 illustrates a schematic diagram of one of the SRAM cells of the SRAM array in FIG. 1. The SRAM cell 40nm of FIG. 2 corresponds to a SRAM cell 40 in the nth row and mth column (where n and m are positive real numbers).

The SRAM cell 40nm of FIG. 2 is a six transistor, low voltage, low power SRAM cell. The SRAM cell 40nm includes a first inverter 42 having a first pull-up transistor M1 coupled between the first voltage Vdd (i.e. the supply voltage) and an output node N1 of the first inverter 42. The first inverter 42 also has a first pull-down transistor M2 coupled between the output node N1, and the second voltage Vss (e.g., ground). The SRAM cell 40nm also includes a second inverter 44 having a second pull-up transistor M3 and a second pull-down transistor M4. The second pull-up transistor M3 is coupled between the first voltage Vdd and an output node N2 of the second inverter 44. The second pull-down transistor M4 is coupled between the output node N2 and the second voltage Vss.

The first inverter 42 and the second inverter 44 are cross-coupled. That is, an input node N3 of the first inverter 42 is coupled to the output node N2 of the second inverter 44, and an input node N4 of the second invertor 44 is coupled to the output node N1 of first inverter 42. The cross-coupled inverters 42 and 44 act as a bistable latch circuit. A bistable latch relies on transistor gain and reinforcing feedback so that it can assume one of two possible states. The state that the bistable latch is in represents a bit of data, i.e., a 1 or 0. The bistable latch can only be programmed (or induced to change) from one state to another by the application of an external signal. Accordingly, access to the bistable latch is controlled to both apply the external signal and preserve the current state.

To control access to the bistable latch, the SRAM cell 40nm may include a first access transistor M5 and a second access transistor M6. The first access transistor M5 may be coupled between the output node N1 of the first invertor 42 and a bit line BLm of the mth column. The second access transistor M6 may be coupled between output node N2 of second inverter 44 and an inverse bit line BLNm of the mth column. Gates of the first access transistor M5 and the second access transistor M6 are coupled to a word line WLn of the nth row.

Because access to the bistable latch is via access transistors (e.g., row access transistors), the voltage stored by the SRAM cell 40nm may be less than the first voltage (i.e., the supply voltage). For example, where access is controlled by applying the first voltage Vdd to the gate of an n-type transistor (as illustrated in FIG. 2), the source may only go up to one threshold voltage Vth of the access transistor from the gate voltage. That is, the output of the access transistor may be a voltage less than the first voltage Vdd by its threshold voltage Vth. For example, if the voltage supply (i.e., the voltage at the drain and gate) is 1.8 V and the threshold voltage Vth is 0.8 V, the voltage stored in the SRAM cell (i.e., the source voltage) is 1V.

The word line WLn may be operated by a portion of the word line driver 20 corresponding to the nth row of SRAM cells 40n. Access to the SRAM cell 40nm is enabled by the word line WLn, which controls the first access transistor M5 and the second access transistor M6, which, in turn control whether or not the first inverter 42 and the second inverter 44 are coupled to the bit line BLm and the inverse bit line BLNm.

The SRAM cell 40nm has three different states: standby, writing, and reading. The operations of these states are as follows.

In standby, the word line WLn is not asserted, and the first access transistor M5 and the second access transistor M6 disconnect the first inverter 42 and the second inverter 44 from the bit line BLm and the bit line BLNm. The two cross-coupled inverters 42 and 44 will continue to reinforce each other as long as they are connected to the first voltage Vdd and the second voltage Vss. This way, the data bit stored in the SRAM cell 40nm is preserved.

The start of the write cycle begins by applying the value to be written to the bit lines. Because the bit lines are provided as a complementary pair, i.e., the bit line BLm and the inverse bit line BLNm, the bit line BLm is driven to the logic state representing the value to be written and the inverse bit line BLNm is driven with the complementary value. For example, if the value to be written is 0, the bit line BLm is driven to a logic level 0, and the inverse bit line is driven to a logic level 1. Next, the word line WLn is asserted to turn on the first access transistor MS and the second access transistor M6. Therefore, the bit lines BLm and BLNm are now coupled to the cross-coupled inverters 42 and 44. Because the bit line driver 30 is designed to be much stronger than the relatively weak transistors in the SRAM cell 40nm, the prior state of the SRAM cell 40nm is overwritten. Thus, the value is stored.

According to an embodiment of the present invention, the bit lines BL0 to BLm and the inverse bit lines BLN0 to BLNm are driven by a plurality of write circuits 32 included in the bit line driver 30. The write circuits 32 correspond to the columns of SRAM cells 40; thus, the mth column of SRAM cells 40m are driven by the mth write circuit 32m. The write circuits 32 may be designed to drive the bit lines BL0 to BLm and the inverse bit lines BLN0 to BLNm to a voltage less than the first voltage Vdd by a threshold voltage of a transistor when writing a logic level of 1 to the bit lines BL0 to BLm and the inverse bit lines BLN0 to BLNm. Accordingly, a power consumed by driving the bit line pair may be reduced. A detailed description of the write circuit 32m is given below in connection with FIGS. 3 and 4.

The read cycle is started by pre-charging both the bit line BLm and the inverse bit line BLNm to a logic level 1. The corresponding word line WLn is then asserted by the word line driver 20 enabling both the access transistors M5 and M6. The value stored in the SRAM cell 40nm is then transferred to the bit line BLm and the inverse bit line BLNm, by pulling down the one of the lines of the complementary bit line pair that is coupled to the output node having the 0 logic level. The complementary bit line pair is then sensed by a sense amplifier (not shown) to detect the stored bit value.

According to an embodiment of the present invention, the bit lines BL0 to BLm and the inverse bit lines BLN0 to BLm are pre-charged by a plurality of pre-charge circuits 34 included in the bit line driver 30. The pre-charge circuits 34 correspond to the columns of SRAM cells 40; thus, the mth column of SRAM cells 40m are pre-charged by the mth pre-charge circuit 34m. The pre-charge circuits may be designed to pre-charge the bit lines BL0 to BLm and the inverse bit lines BLN0 to BLNm to a voltage less than the first voltage by a threshold voltage of a transistor when pre-charging the bit lines BL0 to BLm and the inverse bit lines BLN0 to BLNm. Accordingly, a power consumed by pre-charging the bit line pair may be reduced. A detailed description of the pre-charge circuit 34m is given below in connection with FIGS. 5 and 6.

While the SRAM cell 40nm has been illustrated and described in connection with a 6 T SRAM cell having n-type access transistors, the present invention is not limited thereto. For example, embodiments of the present invention may provide for an 8 T or 10 T SRAM cell and/or SRAM cells having p-type access transistors.

Figure 3:
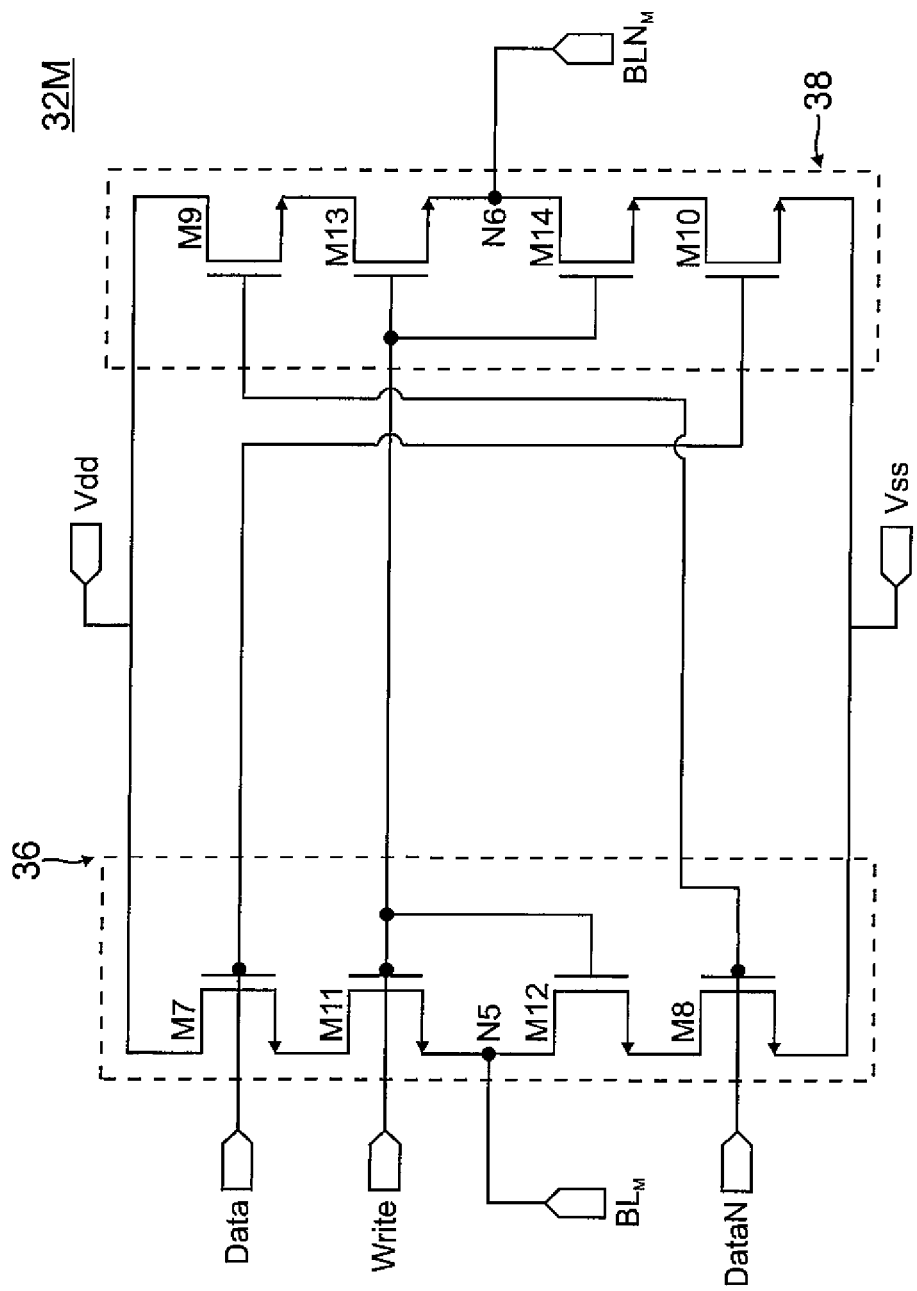
FIG. 3 is a schematic diagram of a write circuit of a bit line driver of the SRAM array of FIG. 1.
Figure 4:
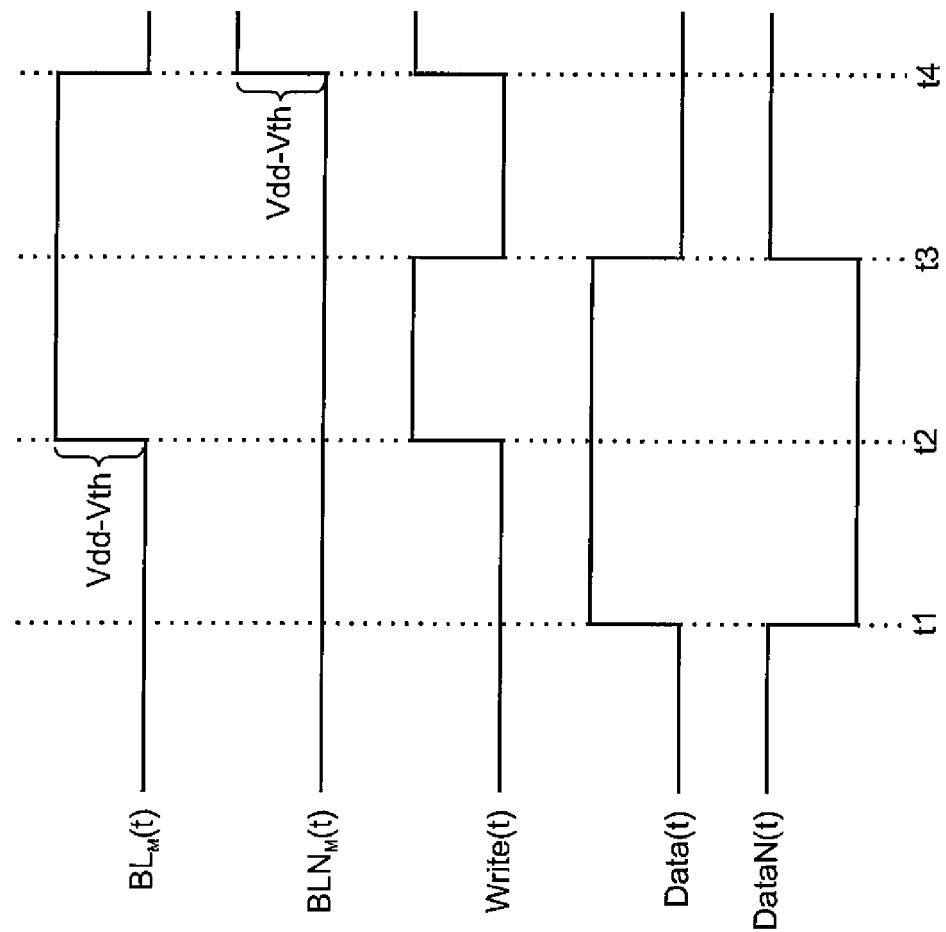
FIG. 4 is a timing diagram of the write circuit of FIG. 3.

Write circuits 32 according to an embodiment of the present invention will now be described in connection with FIGS. 3 and 4. FIG. 3 illustrates a schematic diagram of a write circuit included in the bit line driver of the SRAM array of FIG. 1. FIG. 4 is a timing diagram of the write circuit illustrated in FIG. 3. The write circuit 32m illustrated in FIG. 3 corresponds to the SRAM cells 40m, the bit line BLm, and the inverse bit line BLNm associated with the mth column in the SRAM array 10.

As described above, the SRAM cells 40 may store the logic value 1 as a voltage that is less than the first voltage Vdd by a threshold voltage Vth of a transistor. Because the power consumed by the bit line pairs is proportional to the square of the voltage swing of the bit line pairs, providing a voltage to the bit line pairs that is higher than the first voltage Vdd less the threshold voltage Vth may consume more power than necessary. Accordingly, when the write circuits 32 according to an embodiment of the present invention write the logic level 1 to any of the bit lines BL0 to BLm or the inverse bit lines BLN0 to BLNm, they do so by providing a voltage that is less than the first voltage Vdd by a threshold voltage Vth of a transistor. Thus, power consumption is reduced.

In FIG. 3, the write circuit 32m is coupled to the mth bit line BLm and inverse bit line BLNm. The write circuit 32m may transmit bit information to a column of SRAM cells 40m according to a data signal Data, an inverse data signal DataN (which is a complementary signal to Data), and a write signal Write. The data signal Data, the inverse data signal DataN, and the write signal Write may be included in the input/output data received from the input/output bus I/O.

The write circuit 32m of FIG. 3 is an eight transistor, low voltage, low power write circuit. The write circuit 32 may include a first inverter 36 having a first pull-up transistor M7 coupled between the first voltage Vdd (i.e., a supply voltage) and an output node N5 of the first inverter 36. The first inverter 36 may also have a first pull-down transistor M8 coupled between its output node N5 and the second voltage Vss (e.g., a ground). The output node N5 of the first inverter 36 is coupled to the corresponding bit line BLm. The write circuit 32 may also include a second inverter 38 having a first pull-up transistor M9 and a second pull-down transistor M10. The first pull-up transistor M9 may be coupled between the first voltage Vdd and an output node N6 of the second inverter 38. The second pull-down transistor M10 may be coupled between the output node N6 of the second inverter 38 and the second voltage Vss. The output node N6 of the second inverter 38 is coupled to the corresponding inverse bit line BLNm.

The first pull-up transistor M7 and the second pull-down transistor M10 are configured to turn on and off together. Accordingly, a gate of the first pull-up transistor M7 may be coupled to a gate of the second pull-down transistor M10. Additionally, the first pull-up transistor M7 and the second pull-down transistor M10 may be coupled to the data signal Data, and turn on and off according to the data signal Data.

The second pull-up transistor M9 and the first pull-down transistor M8 are configured to turn on and off together. Accordingly, a gate of the second pull-up transistor M9 may be coupled to a gate of the first pull-down transistor M8. Additionally, the second pull-up transistor M9 and the first pull-down transistor M8 may be coupled to the inverse data signal DataN, and turn on and off according to the inverse data signal DataN.

Accordingly, the first inverter 36 and the second inverter 38 are configured to drive their output nodes in a complementary manner according to the data signal Data and the inverse data signal DataN. For example, when the data signal Data is high, the inverse data signal DataN is low, the output of the first inverter 36 may be high and the output of the second inverter 38 may be low.

The write circuit 32m may additionally include a pair of access circuits to control access to the bit line BLm and the inverse bit line BLNm according to the write signal Write. That is, the inverters 36 and 38 may only drive the bit line BLm and the inverse bit line BLNm when the write signal Write is enabled. Each access circuit may be associated with a corresponding inverter of the write circuit 32. The first access circuit may include a first access transistor M11 and a second access transistor M12. The first access transistor M11 may be interposed between the first pull-up transistor M7 and the output node N5 of the first inverter 36, and the second access transistor M12 may be interposed between the first pull-down transistor M8 and the output node N5 of the first inverter 36. Additionally, the second access circuit may include a third access transistor M13 and a fourth access transistor M14. The third access transistor M13 may be interposed between the second pull-up transistor M9 and the output node N6 of the second inverter 38, and the fourth access transistor M14 may be interposed between the second pull-down transistor M10 and the output node N6 of the second inverter 38. Gates of the first through fourth access transistors may be coupled to the write signal Write to enable access to the bit line BLm and the inverse bit line BLN when the write signal Write is enabled.

At least one of the transistors in the first inverter 36 and the second inverter M8 may be of the same type as the access transistors M5 and M6 of the SRAM cell 40nm. For example, the first and second pull-up transistors M7 and M9 may be the same type of transistor as the access transistors M5 and M6 of the SRAM cell 40nm. However the present invention is not limited thereto, e.g., the first and third access transistors M11 and M13 may be of the same type as the access transistors M5 and M6 of the SRAM cell 40nm, or all of the transistors M7 through M14 of the write circuit 32m may be of the same type as the access transistors M5 and M6 of the SRAM cell 40nm.

In FIG. 3, each of the transistors M7 through M14 are depicted as n-type transistors. Additionally, as described above, the write circuit 32m of FIG. 3 may be used together with the SRAM cell 40nm of FIG. 2, which depicts the access transistors M5 and M6 as n-type transistors as well. In this embodiment, because the access transistors M5 and M6 are n-type transistors, they may only output at their source a voltage that is less than the gate voltage by their threshold voltage Vth. For example, if the gate and drain are driven at the first voltage Vdd, the output voltage (i.e., the voltage stored in the SRAM cell 40nm) would be the first voltage Vdd minus its threshold voltage Vth.

Also, in this embodiment, because the first and second pull-up transistors M7 and M9 of the write circuit 32m are n-type transistors, they too may only pass up to a voltage that is less than the gate voltage by their threshold. As such, if their gate voltage is the first voltage Vdd and their threshold voltage is the same as the access transistors M5 and M6 of the SRAM cell 40nm, the high level voltage supplied to the bit line BLm and the inverse bit line BLNm may be up to the same level as can be passed to the SRAM cell 40nm. Therefore, the high voltage output from the write circuit 32m may be reduced, which in turn, may reduce the consumption of the SRAM array 10 proportional to the reduction in voltage squared. For example, for a SRAM array 10 with a 1.8 V supply voltage and 0.8 V threshold voltages, the reduction in power may be by a factor of 3.24 (i.e., $1.8^2/(1.8-0.8)^2$).

The operation of the write circuit 32m may be further described with reference to FIG. 4. FIG. 4 shows an example timing diagram associated with the write driver 32m. As can be seen in the diagram, the write circuit 32m only outputs a signal to the bit line BLm and the inverse bit line BLNm when the write signal Write is enabled. For example, when the data signal Data is high, the inverse data signal DataN is low, and the write signal Write is low, the write circuit 32m will not output a signal to the bit line BLm and the inverse bit line BLNm. However, when the data signal is high, the inverse data signal DataN is low, and the write signal Write is high, the write circuit 32m will output a logic high to the bit line BLm and a logic low to the inverse bit line BLNm. Here, the logic high is represented by a voltage that is less than the first voltage Vdd by the threshold voltage Vth of the first pull-up transistor M7 of the write circuit 32m.

Figure 5:
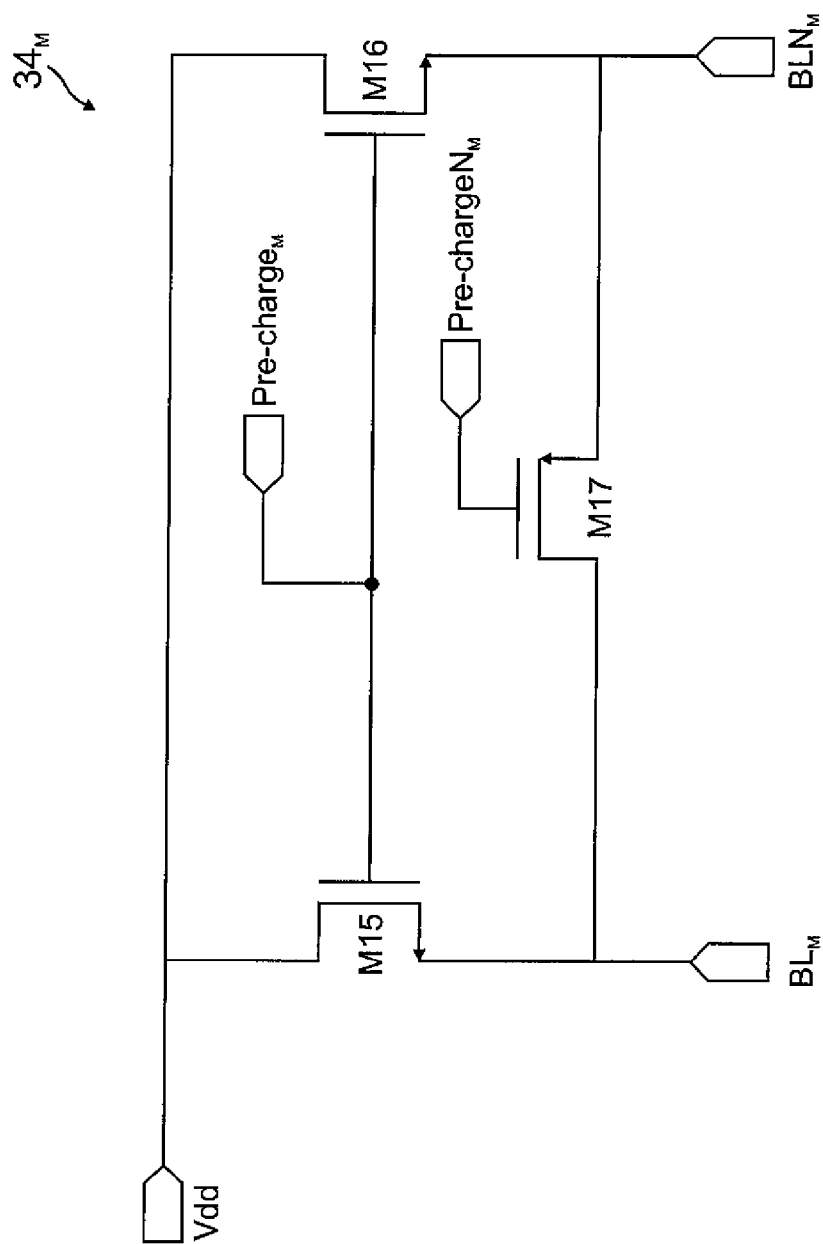
FIG. 5 is a schematic diagram of a pre-charge circuit of the bit line driver of the SRAM array of FIG. 1.

A pre-charge circuit 34m of the pre-charge circuits 34 will now be described in connection with FIGS. 5 and 6. FIG. 5 illustrates a schematic diagram of a pre-charge circuit of the bit line driver included in the SRAM array of FIG. 1. FIG. 6 is a timing diagram of the pre-charge circuit of FIG. 5. Like the write circuit described above, the pre-charge circuit according to an embodiment of the present invention charges the bit line pair up to the supply voltage minus a threshold voltage of a transistor to reduce energy consumption.

The pre-charge circuit 34m is coupled to the mth column of SRAM cells 40m, and the mth bit line BLm and inverse bit line BLNm. As described above, the pre-charge circuit pre-charges the bit line BLm and the inverse bit line BLNm at the start of the read cycle. The pre-charge circuit 34m may be controlled according to a pre-charge signal Pre-charge and an inverse pre-charge signal PrechargeN, which is the complementary signal of the pre-charge signal Pre-charge. The pre-charge signal Pre-charge and the inverse pre-charge signal Pre-chargeN may be provided to the pre-charge circuit 32m from the input/output bus I/O. Additionally, the pre-charge signal Pre-charge and the inverse pre-charge signal Pre-chargeN may be one of a plurality of pre-charge signals and inverse pre-charge signals each corresponding to a column of SRAM cells 40.

The pre-charge circuit 34m includes a first pull-up transistor M15 and a second pull-up transistor M16. The first pull-up transistor M15 is coupled between the first voltage Vdd and the bit line BLm. The second pull-up transistor M16 is coupled between the first voltage Vdd and the inverse bit line BLm. The pull-up transistors are turned on according to the pre-charge signal Pre-charge.

The first and second pull-up transistors M15 and M16 may be the same type of transistor as the access transistors M5 and M6 of the SRAM cell 40nm. Accordingly, the pre-charge circuit 34m may charge the bit line BLm and the inverse bit line BLm to (or closer to) the voltage that the access transistors M5 and M6 of the SRAM cell 40nm can pass into the SRAM cell 40nm. For example, when the access transistors M5 and M6 of the SRAM cell 40nm are n-type transistors, as shown in FIG. 2, the first and second pull-up transistors M15 and M16 may also be n-type transistors. Therefore, if the access transistors M5 and M6 of the SRAM cell 40nm and the pull-up transistors M15 and M16 of the pre-charge circuit are all driven with the first voltage Vdd at the gate and have a same threshold voltage Vth, the voltage passed into the SRAM cell 40nm during a read cycle may be the same as the voltage pre-charged on the bit line BLm and the inverse bit line BLNm. Namely, the first voltage Vdd minus the threshold voltage Vth. Accordingly, power consumption of the SRAM array 10 may be reduced.

Additionally, the pre-charge circuit 34m may include a balancing transistor M17. The balancing transistor may couple the bit line BLm to the inverse bit line BLNm to balance the voltages on the two lines. The balancing transistor M17 may turn on when the inverse pre-charge signal Pre-chargeN is enabled.

The operation of the pre-charge circuit 34m may be further described with reference to FIG. 6. FIG. 6 shows an example timing diagram associated with the write driver 34m. Specifically, FIG. 6 illustrates the relation of the signals of the bit line BLm, the inverse bit line BLNm, the pre-charge signal Pre-charge, and the inverse pre-charge signal Pre-chargeN over time. At time t0, all signals are at a ground voltage (this may be just prior to the read cycle). At time t1, the pre-charge signal Pre-charge is low and the inverse pre-charge signal Pre-chargeN is high. Here, the bit line pair is coupled through the balancing transistor M17, however, because the voltage level was at ground, no observable voltage balancing occurs. At time t3, the pre-charge signal Pre-charge is high (e.g., at the first voltage Vdd) and the inverse pre-charge signal Pre-chargeN is low. Here the first and second full-up transistors M15 and M16 are turned on to output a voltage that is less than the first voltage Vdd by their threshold voltages Vth. This state is held through time t3, but in t4, the pre-charge signal Pre-charge goes low and the inverse pre-charge signal Pre-chargeN goes high. Here, the balancing transistor M17 is on and the voltages on the bit line pair are balanced. The difference in voltage may be due to, for example, a difference in the threshold voltage of the transistors.

Accordingly, embodiments of the present invention provide for a low power, low voltage, SRAM cell array including a low power bit line driver. To reduce power, the bit line driver line reduces the voltage swing on the complementary bit line pair. By reducing this voltage swing, the power consumed by the SRAM cell array may be reduced according to the square of the voltage reduction.

While embodiments of the low power SRAM array according to the present invention have been illustrated and described in connection with certain exemplary embodiments, it is to be understood that the invention is not limited to the described embodiments, but, on the contrary, is intended to cover various modifications and equivalent arrangements included within the spirit and scope of the appended claims. For example, while embodiments of the present invention were described as having both the pre-charge circuit and write circuit according to the present invention in the bit line driver, embodiments of the present invention are not limited thereto and may include one, the other, or both in the bit line driver.

What is claimed is:

1. A bit line driver for a static random access memory (SRAM) cell comprising:
   a first voltage supply for supplying a first voltage;
   a second voltage supply for supplying a second voltage that is less than the first voltage;
   a write circuit configured to drive a bit line and an inverse bit line when writing to the SRAM cell; and
   a pre-charge circuit configured to pre-charge the bit line and the inverse bit line before reading the content of the SRAM cell,
   wherein the write circuit is configured to supply a voltage less than the first voltage by a threshold voltage of one transistor to the bit line when the write circuit drives the bit line to a high state, and
   wherein the write circuit is configured to supply the voltage less than the first voltage by the threshold voltage of one transistor to the inverse bit line when the write circuit drives the inverse bit line to the high state.

2. The bit line driver of claim 1,
   wherein the write circuit comprises:
   a pair of pull-up circuits;
   a pair of pull-down circuits each having a gate cross-coupled with a gate of an opposite side pull-up circuit of the pair of pull-up circuits; and
   a pair of access circuits each interposed between a corresponding one of the pull-up circuits and a same-side pull-down circuit of the pair of pull-down circuits, and
   wherein the write circuit is configured to selectively pull-up or pull-down the bit line and the inverse bit line according to a data signal and a write signal.

3. The bit line driver of claim 2,
   wherein the pair of pull up circuits comprises:
   a first transistor coupled between the first voltage supply and the bit line; and
   a second transistor coupled between the first voltage supply and the inverse bit line,
   wherein the pair of pull down circuits comprises:
   a third transistor coupled between the second voltage supply and the bit line; and
   a fourth transistor coupled between the second voltage supply and the inverse bit line, and
   wherein the pair of access circuits comprises:
   a fifth transistor interposed between the first transistor and the bit line;
   a sixth transistor interposed between the second transistor and the inverse bit line;
   a seventh transistor interposed between the third transistor and the bit line; and
   an eighth transistor interposed between the fourth transistor and the inverse bit line.

4. The bit line driver of claim 3,
   wherein the first transistor and the fourth transistor are configured to be turned on and off together,
   wherein the second transistor and the third transistor are configured to be turned on and off together, and
   wherein the fifth transistor, the sixth transistor, the seventh transistor, and the eighth transistor are configured to be turned on and off together.

5. The bit line driver of claim 4,
   wherein the first transistor and fourth transistor are configured to be turned on and off according to the data signal,
   wherein the second transistor and the third transistor are configured to be turned on and off according to an inverse data signal, which is the inverse of the data signal; and wherein the fifth transistor, the sixth transistor, the seventh transistor, and the eighth transistor are configured to be turned on and off according to the write signal.

6. The bit line driver of claim 3,
wherein at least one of the first transistor and the third transistor and at least one of the second transistor and the fourth transistor are a same type of transistor as a row access transistor of the SRAM cell.

7. The bit line driver of claim 3,
wherein the first transistor, the second transistor, the third transistor, the fourth transistor, the fifth transistor, the sixth transistor, the seventh transistor, and the eighth transistor are n-type transistors.

8. The bit line driver of claim 3,
wherein the first transistor, the second transistor, the third transistor, the fourth transistor, the seventh transistor, and the eighth transistor are n-type transistors, and
wherein the fifth transistor and the sixth transistor are p-type transistors.

9. The bit line driver of claim 1,
wherein the pre-charge circuit is configured to supply the voltage less than the first voltage by the threshold voltage of one transistor to the bit line when the pre-charge circuit drives the bit line to the high state, and
wherein the pre-charge circuit is configured to supply the voltage less than the first voltage by the threshold voltage of one transistor to the inverse bit line when the pre-charge circuit drives the inverse bit line to the high state.

10. The bit line driver of claim 9,
wherein the pre-charge circuit comprises:
a first pull-up circuit configured to pull-up the bit line to the voltage less than the first voltage by the threshold voltage of one transistor according to a pre-charge signal;
a second pull-up circuit configured to pull-up the inverse bit line to the voltage less than the first voltage by the threshold voltage of one transistor according to the pre-charge signal; and
a balancing circuit configured to balance a voltage of the bit line with a voltage of the inverse bit line according to an inverse pre-charge signal.

11. The bit line driver of claim 10,
wherein the first pull-up circuit comprises a first transistor interposed between the first voltage supply and the bit line,
wherein the second pull-up circuit comprises a second transistor interposed between the first voltage supply and the inverse bit line, and
wherein the balancing circuit comprises a third transistor coupled between the bit line and the inverse bit line.

12. The bit line driver of claim 11,
wherein the first transistor and the second transistor are a same type of transistor as a row access transistor of the SRAM cell.

13. The bit line driver of claim 11,
wherein the first transistor and the second transistor are n-type transistors and the third transistor is a p-type transistor.

14. A static random access memory (SRAM) array comprising:
a plurality of word lines arranged in rows, each of the word lines for supplying a corresponding one of a plurality of word signals;
a plurality of bit lines arranged in columns, each of the bit lines for supplying a corresponding one of a plurality of bit signals;
a plurality of inverse bit lines arranged with the bit lines in columns, each of the inverse bit lines for supplying a corresponding one of a plurality of inverse bit signals that is the inverse of the bit signal supplied by the corresponding one of the bit lines in a same column;
a first voltage supply for supplying a first voltage;
a second voltage supply for supplying a second voltage that is less than the first voltage;
a plurality of SRAM cells arranged in rows and columns, each of the SRAM cells corresponding to one of each of the word lines, the bit lines, and the inverse bit lines;
a word line driver configured to drive the word lines; and
a bit line driver configured to drive the bit lines and the inverse bit lines,
wherein the bit line driver is configured to supply a voltage less than the first voltage by a threshold voltage of one transistor of the bit line driver to the one of the bit lines when the bit line driver drives one of the bit lines to a high state, and
wherein the bit line driver is configured to supply the voltage less than the first voltage by a threshold voltage of one transistor of the bit line driver to the one of the inverse bit lines when the bit line driver drives one of the inverse bit lines to the high state.

15. The SRAM array of claim 14,
wherein the bit line driver comprises a plurality of write circuits, each of the write circuits corresponding to a bit line of the bit lines, an inverse bit line of the inverse bit lines, and a column of the SRAM cells,
wherein each of the write circuits comprises:
a pair of pull-up circuits;
a pair of pull-down circuits each having a gate cross-coupled with a gate of an opposite side pull-up circuit of the pair of pull-up circuits; and
a pair of access circuits each interposed between a corresponding one of the pull- up circuits and a same-side pull-down circuit of the pair of pull-down circuits, and
wherein each of the write circuits is configured to selectively pull-up or pull-down the bit line and the inverse bit line according to a data signal and a write signal.

16. The SRAM array of claim 15,
wherein the pair of pull-up circuits comprise n-type transistors.

17. The SRAM array of claim 14,
wherein the bit line driver comprises a plurality of pre-charge circuits, each of the pre-charge circuits corresponding to a bit line of the bit lines, an inverse bit line of the inverse bit lines, and a column of the SRAM cells, and
wherein each of the pre-charge circuits comprises:
a first pull-up circuit configured to pull-up the bit line to the voltage less than the first voltage by the threshold voltage of one transistor according to a pre-charge signal;
a second pull-up circuit configured to pull-up the inverse bit line to the voltage less than the first voltage by the threshold voltage of one transistor according to the pre-charge signal; and
a balancing circuit configured to balance a voltage of the bit line with a voltage of the inverse bit line according to an inverse pre-charge signal.

18. The SRAM array of claim 17,
wherein the first pull-up circuit and the second pull-up circuit comprise n-type transistors.

19. The SRAM array of claim 14,
wherein each of the SRAM cells comprises:
  a first transistor comprising:
    a gate coupled to the corresponding word line;
    a source coupled to the corresponding inverse bit line; and
    a drain;
  a second transistor comprising:
    a gate coupled to the corresponding word line;
    a source coupled to the corresponding bit line; and
    a drain
  a third transistor comprising:
    a gate coupled to the drain of the second transistor;
    a source coupled to the second voltage supply; and
    a drain coupled to the drain of the first transistor;
  a fourth transistor comprising:
    a gate coupled to the drain of the first transistor;
    a source coupled to the second voltage supply; and
    a drain coupled to the drain of the second transistor;
  a fifth transistor comprising:
    a gate coupled to the drain of the second transistor;
    a source coupled to the first voltage supply; and
    a drain coupled to the drain of the first transistor; and
  a sixth transistor comprising:
    a gate coupled to the drain of the first transistor
    a source coupled to the first voltage supply; and
    a drain coupled to the drain of the second transistor,
wherein the first transistor, the second transistor, the third transistor, and the fourth transistor are n-type transistors, and
wherein the fifth transistor and the sixth transistor are p-type transistors.

* * * * *